(12) United States Patent
Sato et al.

(10) Patent No.: US 11,711,063 B2
(45) Date of Patent: Jul. 25, 2023

(54) MULTILAYER FILTER DEVICE

(71) Applicant: TDK CORPORATION, Tokyo (JP)

(72) Inventors: Takuya Sato, Tokyo (JP); Kazuhiro Tsukamoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/685,442

(22) Filed: Mar. 3, 2022

(65) Prior Publication Data
US 2022/0294407 A1 Sep. 15, 2022

(30) Foreign Application Priority Data
Mar. 9, 2021 (JP) .................. 2021-037865

(51) Int. Cl.
*H03H 7/01* (2006.01)
*H03H 1/00* (2006.01)

(52) U.S. Cl.
CPC ... *H03H 7/0115* (2013.01); *H03H 2001/0085* (2013.01)

(58) Field of Classification Search
CPC .................. H01P 1/203; H03H 7/0115; H03H 2001/0085

USPC ................................... 333/175, 185
See application file for complete search history.

(56) References Cited

U.S. PATENT DOCUMENTS

| 5,235,298 A | * | 8/1993 | Banno | H01P 1/20336 333/204 |
| 5,344,695 A | * | 9/1994 | Hirai | H01P 1/20336 428/209 |
| 6,108,192 A |   | 8/2000 | Sugimoto et al. | |

* cited by examiner

Primary Examiner — Rakesh B Patel
(74) Attorney, Agent, or Firm — Oliff PLC

(57) ABSTRACT

A filter device includes a filter including at least one inductor and at least one capacitor, and a stack of a plurality of dielectric layers and a plurality of conductor layers. The plurality of dielectric layers include at least one first dielectric layer formed of a first dielectric material and at least one second dielectric layer formed of a second dielectric material. The plurality of conductor layers include at least one first conductor layer in contact with the at least one first dielectric layer, and at least one second conductor layer in contact with the at least one second dielectric layer. The temperature coefficient of resonant frequency of the first dielectric material has a positive value. The temperature coefficient of resonant frequency of the second dielectric material has a negative value.

9 Claims, 13 Drawing Sheets

MULTILAYER FILTER DEVICE

BACKGROUND OF THE INVENTION

1. Field of the Invention

The present invention relates to a multilayer filter device including a filter and a stack.

2. Description of the Related Art

The recent market demands for reductions in size and footprint of the compact mobile communication apparatuses have also required miniaturization of band-pass filters for use in those communication apparatuses. Among known band-pass filters suited for miniaturization are ones that use a stack of dielectric layers and conductor layers. A band-pass filter using such a stack will hereinafter be referred to as a multilayer band-pass filter.

The characteristics of a multilayer band-pass filter can change with temperature. U.S. Pat. No. 6,108,192 A discloses a dielectric ceramic compound having a low rate of change of permittivity with temperature and a ceramic electronic component using the dielectric ceramic compound.

Aside from the permittivity of the dielectric layers constituting the stack, the pass characteristic of the multilayer band-pass filter can also change with temperature. The pass characteristic is shown by a curve obtained by plotting the attenuation of a signal passed through the multilayer band-pass filter at each frequency. The curve showing the pass characteristic shifts to higher or lower frequencies as the temperature changes.

One of the specifications required of the multilayer band-pass filter is a passband. The requirement is that the absolute value of the attenuation in the passband be less than or equal to a predetermined value. However, if the pass characteristic in and near the passband shifts due to temperature, the required value can fail to be met. In particular, a multilayer band-pass filter of which a narrow passband is required can fail to satisfy the required value if the pass characteristic shifts even slightly.

SUMMARY OF THE INVENTION

An object of the present invention is to provide a multilayer filter device capable of reducing a change in the pass characteristic due to temperature.

A multilayer filter device according to the present invention is a multilayer filter device including a filter that includes at least one inductor and at least one capacitor, and a stack that includes a plurality of dielectric layers and a plurality of conductor layers stacked together, where the stack is intended to integrate the at least one inductor and the at least one capacitor. The at least one inductor and the at least one capacitor are formed using the plurality of conductor layers.

The plurality of dielectric layers include at least one first dielectric layer and at least one second dielectric layer. The plurality of conductor layers include at least one first conductor layer in contact with the at least one first dielectric layer and at least one second conductor layer in contact with the at least one second dielectric layer. The first dielectric layer is formed of a first dielectric material having a positive temperature coefficient of resonant frequency. The second dielectric layer is formed of a second dielectric material having a negative temperature coefficient of resonant frequency.

In the multilayer filter device according to the present invention, the stack may have a bottom surface and a top surface that are located at both ends in a stacking direction of the plurality of dielectric layers, and four side surfaces connecting the bottom surface and the top surface. In such a case, the at least one first dielectric layer may be located closer to the bottom surface than to the top surface.

In the multilayer filter device according to the present invention, the at least one second dielectric layer may include a plurality of second dielectric layers. In such a case, the at least one first dielectric layer may be located between one second dielectric layer and another in the plurality of second dielectric layers.

In the multilayer filter device according to the present invention, the at least one capacitor may include a plurality of capacitors. In such a case, the at least one first conductor layer may include a plurality of first conductor layers. At least one of the plurality of capacitors may be constituted by the at least one first dielectric layer and two of the first conductor layers, where the two are located to sandwich the at least one first dielectric layer therebetween.

In the multilayer filter device according to the present invention, the at least one inductor may be formed using the at least one second conductor layer.

In the multilayer filter device according to the present invention, the filter may be a band-pass filter that selectively passes a signal of a frequency within a predetermined passband. In such a case, the passband may have a width in a range of 10 to 600 MHz.

In the multilayer filter device according to the present invention, the plurality of dielectric layers include the at least one first dielectric layer and the at least one second dielectric layer. The first dielectric layer is formed of the first dielectric material having a positive temperature coefficient of resonant frequency. The second dielectric layer is formed of the second dielectric material having a negative temperature coefficient of resonant frequency. According to the present invention, a multilayer filter device capable of reducing a change in the pass characteristic due to temperature can thus be implemented.

Other and further objects, features and advantages of the present invention will appear more fully from the following description.

DETAILED DESCRIPTION OF THE PREFERRED EMBODIMENTS

An embodiment of the present invention will now be described in detail with reference to the drawings. First, a configuration of a multilayer filter device (hereinafter simply referred to as filter device) according to the embodiment of the invention will be outlined. The filter device 1 according to the present embodiment includes a filter 5 including at least one inductor and at least one capacitor. The filter 5 of the present embodiment is a band-pass filter for selectively passing a signal of a frequency within a predetermined passband.

Figure 1:
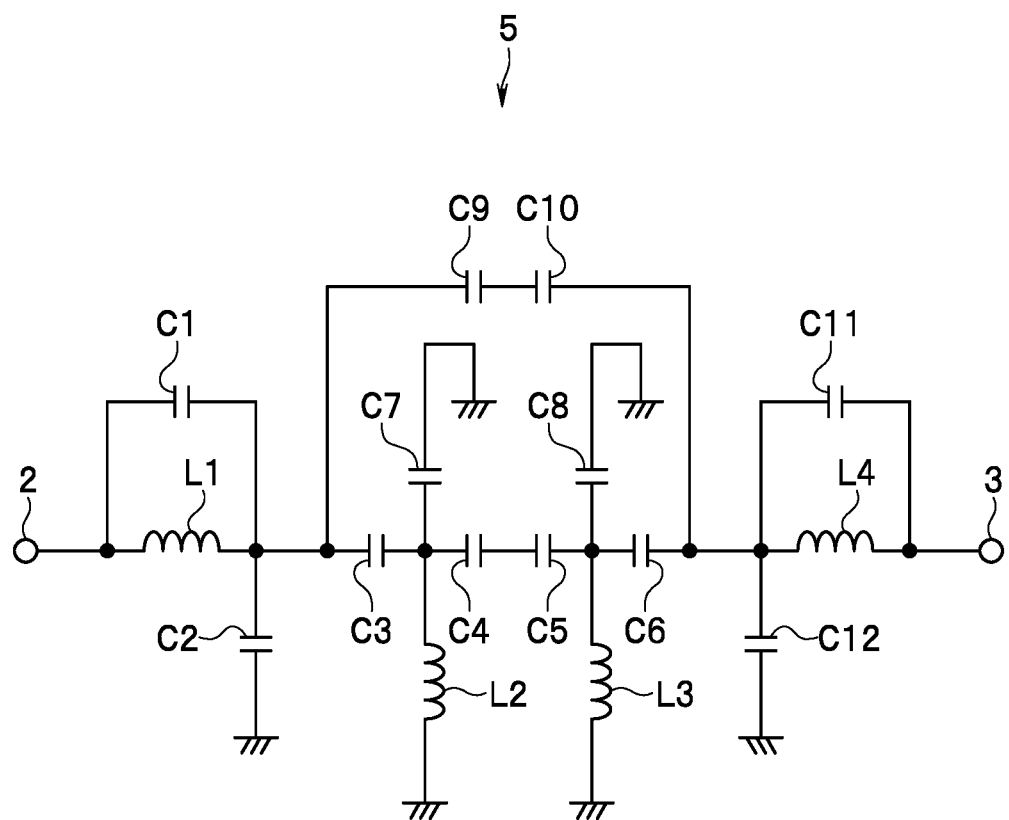
FIG. 1 is a circuit diagram showing a circuit configuration of a filter of an embodiment of the invention.

Next, an example of the configuration of the filter 5 will be described with reference to FIG. 1. FIG. 1 is a circuit diagram showing a circuit configuration of the filter 5. The filter 5 includes a first port 2, a second port 3, inductors L1, L2 L3, and L4, and capacitors C1, C2, C3, C4, C5, C6, C7, C8, C9, C10, C11, and C12. The first and second ports 2 and 3 each function as an input/output port of the band-pass filter.

The inductors L1 to L4 and the capacitors C1 to C12 are provided between the first port 2 and the second port 3 in a circuit configuration. In the present application, the expression of "in a (the) circuit configuration" is used not to indicate a layout in physical configuration but to indicate a layout in the circuit diagram.

One end of the inductor L1 is connected to the first port 2. The capacitor C1 is connected in parallel with the inductor L1. One end of the capacitor C2 is connected to the other end of the inductor L1. The other end of the capacitor C2 is connected to a ground.

One end of the capacitor C3 is connected to the other end of the inductor L1. One end of the capacitor C4 is connected to the other end of the capacitor C3. One end of the capacitor C5 is connected to the other end of the capacitor C4. One end of the capacitor C6 is connected to the other end of the capacitor C5.

One end of the inductor L2 and one end of the capacitor C7 are connected to a connection point between the capacitors C3 and C4. The other end of the inductor L2 and the other end of the capacitor C7 are each connected to the ground.

One end of the inductor L3 and one end of the capacitor C8 are connected to a connection point between the capacitors C5 and C6. The other end of the inductor L3 and the other end of the capacitor C8 are each connected to the ground.

One end of the capacitor C9 is connected to the one end of the capacitor C3. One end of the capacitor C10 is connected to the other end of the capacitor C9. The other end of the capacitor C10 is connected to the other end of the capacitor C6.

One end of the inductor L4 is connected to the other end of the capacitor C6. The other end of the inductor L4 is connected to the second port 3. The capacitor C11 is connected in parallel with the inductor L4. One end of the capacitor C12 is connected to the one end of the inductor L4. The other end of the capacitor C12 is connected to the ground.

Figure 2:
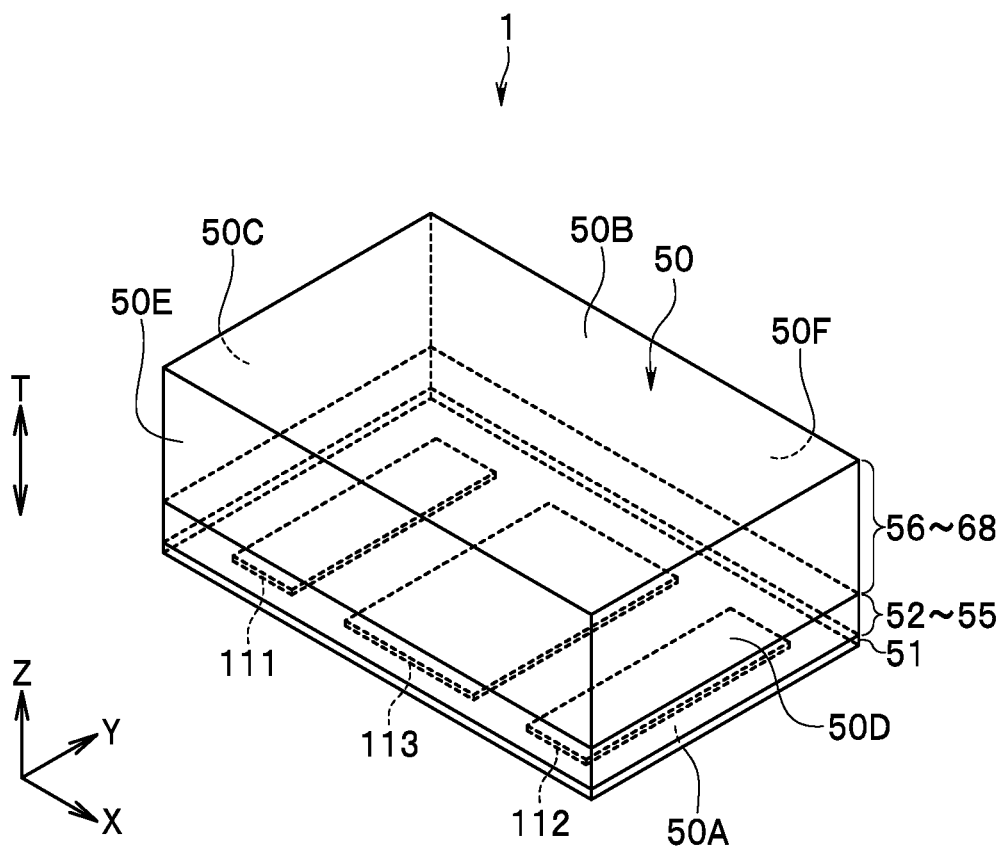
FIG. 2 is an external perspective view showing a multilayer filter device according to the embodiment of the invention.

Next, other configurations of the filter device 1 will be described with reference to FIG. 2. FIG. 2 is an external perspective view showing the filter device 1.

The filter device 1 further includes a stack 50 of dielectric layers and conductor layers. The stack 50 is intended to integrate the first port 2, the second port 3, and the inductors L1 to L4 and the capacitors C1 to C12 of the filter 5. The inductors L1 to L4 and the capacitors C1 to C12 are formed using the plurality of conductor layers.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F are perpendicular to the top surface 50B and the bottom surface 50A.

Here, X, Y, and Z directions are defined as shown in FIG. 2. The X, Y, and Z directions are orthogonal to one another. In the present embodiment, a direction parallel to the stacking direction T will be referred to as the Z direction. The opposite directions to the X, Y, and Z directions are defined as −X, −Y, and −Z directions, respectively.

As shown in FIG. 2, the bottom surface 50A is located at the end of the stack 50 in the −Z direction. The top surface 50B is located at the end of the stack 50 in the Z direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The filter device 1 further includes a plurality of terminals 111, 112, and 113 located at the bottom surface 50A of the stack 50. The terminal 111 extends in the Y direction near the side surface 50C. The terminal 112 extends in the Y direction near the side surface 50D. The terminal 113 is located between the terminals 111 and 112.

The terminal 111 corresponds to the first port 2. The terminal 112 corresponds to the second port 3. The first and second ports 2 and 3 are thus located at the bottom surface 50A of the stack 50. The terminal 113 is connected to the ground.

The plurality of dielectric layers include at least one first dielectric layer and at least one second dielectric layer. The plurality of conductor layers include at least one first conductor layer in contact with the at least one first dielectric layer and at least one second conductor layer in contact with the at least one second dielectric layer.

Now, the temperature coefficients of resonant frequency of dielectric materials will be described. Let fref represent the resonant frequency of a dielectric material at a reference temperature Tref. Let fr represent the resonant frequency of the dielectric material at a predetermined temperature Tr. Let tf represent the temperature coefficient of resonant frequency of the dielectric material in a temperature range from the reference temperature Tref to the temperature Tr. The temperature coefficient of resonant frequency tf (unit: ppm/° C.) is expressed by the following Eq. (1):

$$tf=[(fr-\text{fref})/\{\text{fref}(Tr-\text{Tref})\}]\times 10^6 \qquad (1)$$

The temperature coefficient of resonant frequency tf in the range of −40° C. to 85° C. is determined by Eq. (1), assuming the reference temperature Tref to be −40° C. and the predetermined temperature Tr to be 85° C. In the following description, the temperature coefficient of resonant frequency tf, when simply referred to, indicates the temperature coefficient of resonant frequency tf in the range of −40° C. to 85° C.

The first dielectric layer is formed of a first dielectric material having a positive temperature coefficient of resonant frequency tf. The temperature coefficient of resonant frequency tf of the first dielectric material is in the range of 1 to 1000 ppm/° C., for example. The first dielectric material has a relative permittivity in the range of 10 to 80, for example. Examples of the first dielectric material include a ceramic (hereinafter, referred to as a first ceramic) composed mainly of a component expressed by the composition formula $\{\alpha(x\text{BaO}\cdot y\text{Nd}_2\text{O}_3\cdot z\text{TiO}_2)+\beta(2\text{MgO}\cdot\text{SiO}_2)\}$. Here, $\alpha>0$, $\beta>0$, $x>0$, $y>0$, and $z>0$.

The second dielectric layer is formed of a second dielectric material having a negative temperature coefficient of resonant frequency tf. The temperature coefficient of resonant frequency tf of the second dielectric material is in the range of −1000 to −1 ppm/° C., for example. The second dielectric material has a relative permittivity in the range of 5 to 9, for example. Examples of the second dielectric material include a ceramic (hereinafter, referred to as a second ceramic) composed mainly of a component expressed by the composition formula $\{\gamma(2\text{MgO}\cdot\text{SiO}_2)+\delta((\text{Ca,Sr})\text{TiO}_3)\}$. Here, $\gamma>0$ and $\delta\geq 0$.

The ratio of the absolute value of the temperature coefficient of resonant frequency tf of the first dielectric material to that of the temperature coefficient of resonant frequency tf of the second dielectric material is desirably in the range of 0.1 or more and 10 or less, for example.

Next, an example of the plurality of dielectric layers and the plurality of conductor layers constituting the stack 50 will be described with reference to FIG. 3A to FIG. 6B. In this example, the stack 50 includes eighteen dielectric layers stacked together. The eighteen dielectric layers will be referred to as a first to an eighteenth dielectric layer in the order from bottom to top. The first to eighteenth dielectric layers are denoted by reference numerals 51 to 68, respectively.

Figure 3A:
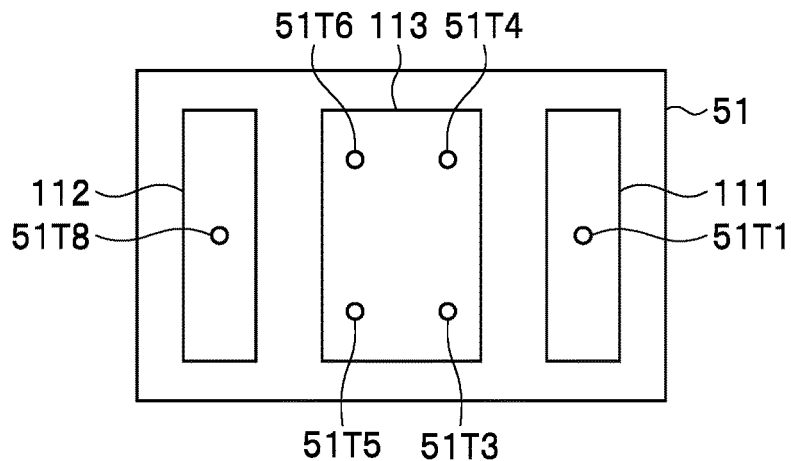
FIG. 3A to FIG. 3C are explanatory diagrams showing respective patterned surfaces of first to third dielectric layers of a stack of the multilayer filter device according to the embodiment of the invention.

FIG. 3A shows the patterned surface of the first dielectric layer 51. The terminals 111, 112 and 113 are formed on the patterned surface of the dielectric layer 51. Further, through holes 51T1, 51T3, 51T4, 51T5, 51T6, and 51T8 are formed in the dielectric layer 51. The through hole 51T1 is connected to the terminal 111. The through holes 51T3 to 51T6 are connected to the terminal 113. The through hole 51T8 is connected to the terminal 112.

Figure 3B:
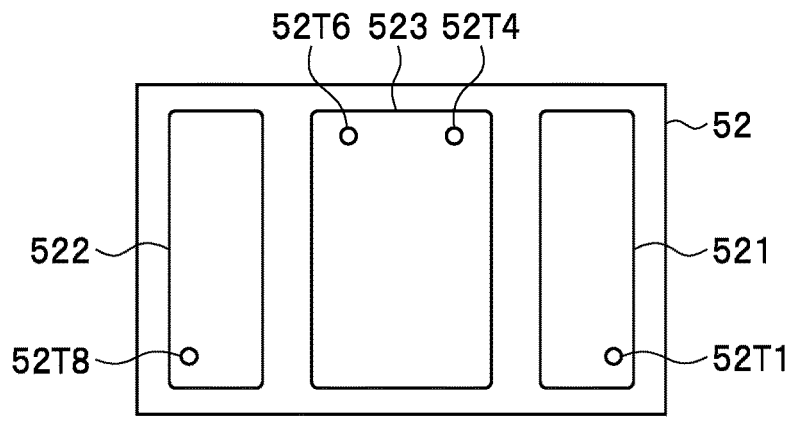

FIG. 3B shows the patterned surface of the second dielectric layer 52. Conductor layers 521 and 522 and a ground conductor layer 523 are formed on the patterned surface of the dielectric layer 52. Further, through holes 52T1, 52T4, 52T6, and 52T8 are formed in the dielectric layer 52. The through hole 51T1 formed in the dielectric layer 51 and the through hole 52T1 are connected to the conductor layer 521. The through holes 51T3 to 51T6 formed in the dielectric layer 51 and the through holes 52T4 and 52T6 are connected to the ground conductor layer 523. The through hole 51T8 formed in the dielectric layer 51 and the through hole 52T8 are connected to the conductor layer 522.

Figure 3C:
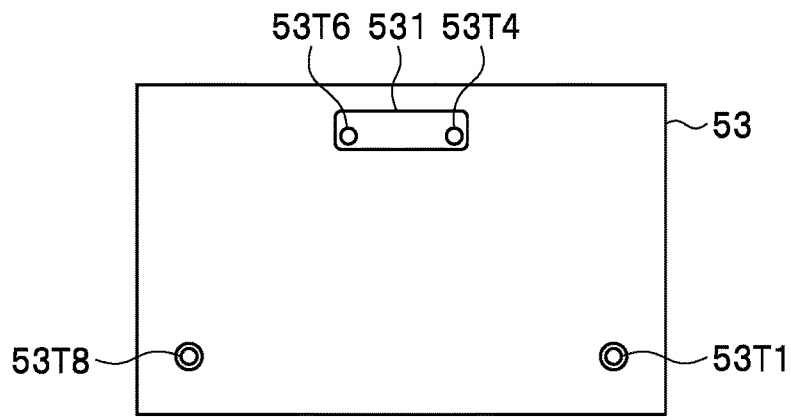

FIG. 3C shows the patterned surface of the third dielectric layer 53. Conductor layer 531 is formed on the patterned surface of the dielectric layer 53. Further, through holes 53T1, 53T4, 53T6, and 53T8 are formed in the dielectric layer 53. The through holes 52T1 and 52T8 formed in the dielectric layer 52 are connected to the through holes 53T1 and 53T8, respectively. The through holes 52T4 and 52T6 formed in the dielectric layer 52 and the through holes 53T4 and 53T6 are connected to the conductor layer 531.

Figure 4A:
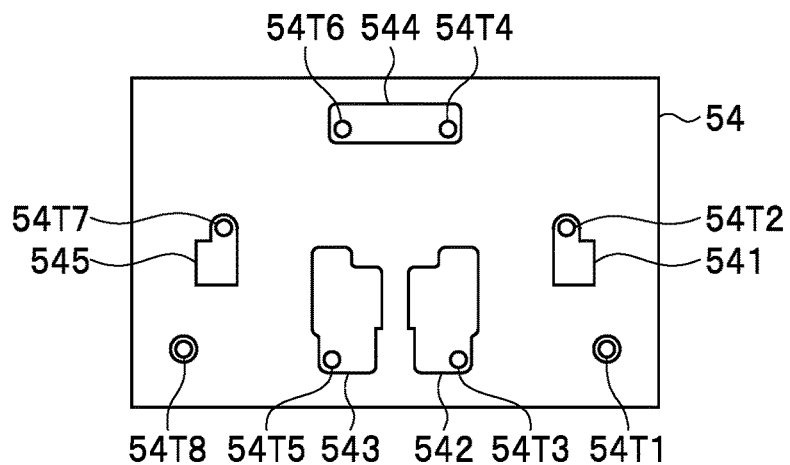
FIG. 4A to FIG. 4C are explanatory diagrams showing respective patterned surfaces of fourth to sixth dielectric layers of the stack of the multilayer filter device according to the embodiment of the invention.

FIG. 4A shows the patterned surface of the fourth dielectric layer 54. Conductor layers 541, 542, 543, 544, and 545 are formed on the patterned surface of the dielectric layer 54. Further, through holes 54T1, 54T2, 54T3, 54T4, 54T5, 54T6, 54T7, and 54T8 are formed in the dielectric layer 54. The through holes 53T1 and 53T8 formed in the dielectric layer 53 are connected to the through holes 54T1 and 54T8, respectively. The through holes 54T2, 54T3, 54T5, and 54T7 are connected to the conductor layers 541, 542, 543, and 545, respectively. The through holes 53T4 and 53T6 formed in the dielectric layer 53 and the through holes 54T4 and 54T6 are connected to the conductor layer 544.

Figure 4B:
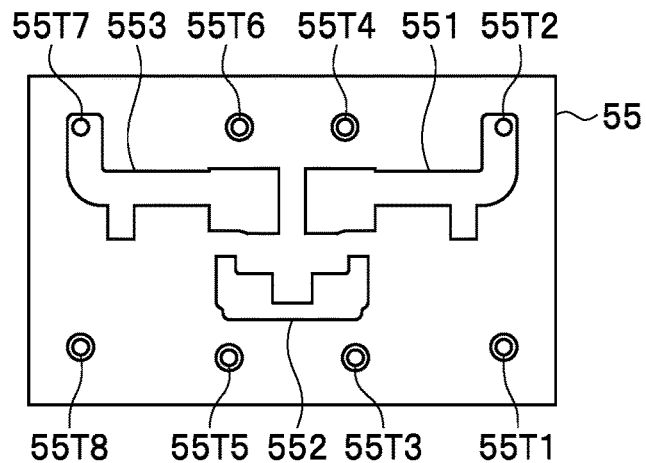

FIG. 4B shows the patterned surface of the fifth dielectric layer 55. Conductor layers 551, 552 and 553 are formed on the patterned surface of the dielectric layer 55. Further, through holes 55T1, 55T2, 55T3, 55T4, 55T5, 55T6, 55T7, and 55T8 are formed in the dielectric layer 55. The through holes 54T1, 54T3 to 54T6, and 54T8 formed in the dielectric layer 54 are connected to the through holes 55T1, 55T3 to 55T6, and 55T8, respectively. The through hole 54T2 formed in the dielectric layer 54 and the through hole 55T2 are connected to the conductor layer 551. The through hole 54T7 formed in the dielectric layer 54 and the through hole 55T7 are connected to the conductor layer 553.

Figure 4C:
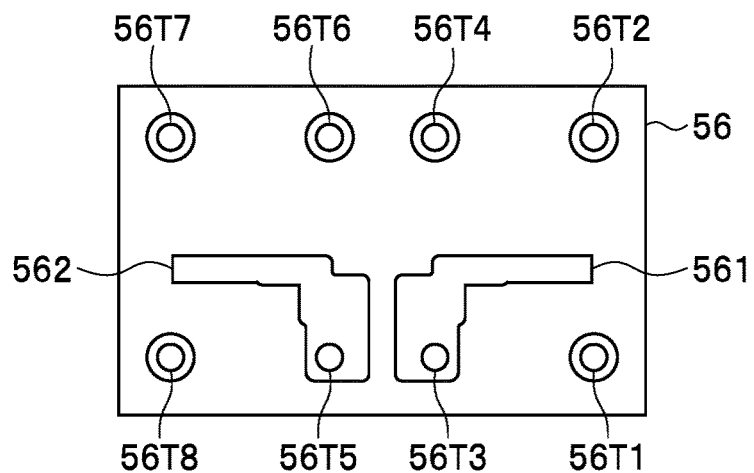

FIG. 4C shows the patterned surface of the sixth dielectric layer 56. Conductor layers 561 and 562 are formed on the patterned surface of the dielectric layer 56. Further, through holes 56T1, 56T2, 56T3, 56T4, 56T5, 56T6, 56T7, and 56T8 are formed in the dielectric layer 56. The through holes 55T1, 55T2, 55T4, and 55T6 to 55T8 formed in the dielectric layer 55 are connected to the through holes 56T1, 56T2, 56T4, and 56T6 to 56T8, respectively. The through hole 55T3 formed in the dielectric layer 55 and the through hole 56T3 are connected to the conductor layer 561. The through hole 55T5 formed in the dielectric layer 55 and the through hole 56T5 are connected to the conductor layer 562.

Figure 5A:
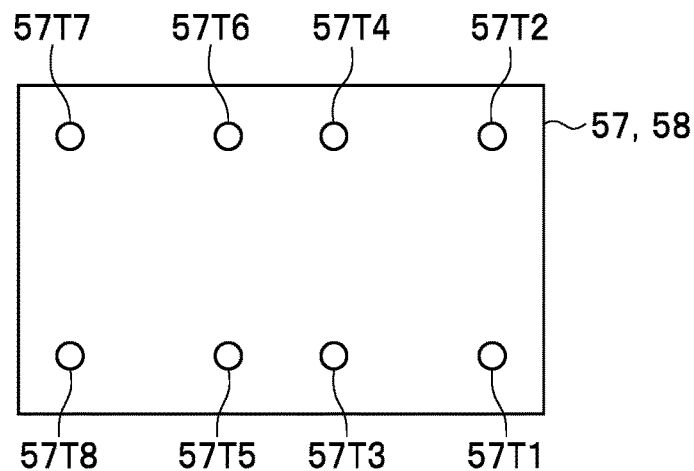
FIG. 5A is an explanatory diagram showing respective patterned surfaces of seventh and eighth dielectric layers of the stack of the multilayer filter device according to the embodiment of the invention.

FIG. 5A shows the patterned surface of each of the seventh dielectric layer 57 and the eighth dielectric layer 58. In each of the dielectric layers 57 and 58, there are formed through holes 57T1, 57T2, 57T3, 57T4, 57T4, 57T5, 57T6, 57T7, and 57T8. The through holes 56T1 to 56T8 formed in the dielectric layer 56 are connected to the through holes 57T1 to 57T8 formed in the dielectric layer 57, respectively. In the dielectric layers 57 and 58, every vertically adjacent through holes denoted by the same reference numerals are connected to each other.

Figure 5B:
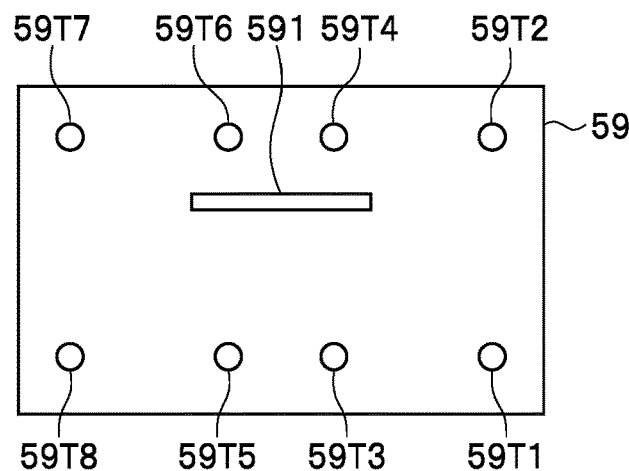
FIG. 5B is an explanatory diagram showing a patterned surface of a ninth dielectric layer of the stack of the multilayer filter device according to the embodiment of the invention.

FIG. 5B shows the patterned surface of the ninth dielectric layer 59. A conductor layer 591 is formed on the patterned surface of the dielectric layer 59. Further, through holes 59T1, 59T2, 59T3, 59T4, 59T5, 59T6, 59T7, and 59T8 are formed in the dielectric layer 59. The through holes 57T1 to 57T8 formed in the dielectric layer 58 are connected to the through holes 59T1 to 59T8, respectively.

Figure 5C:
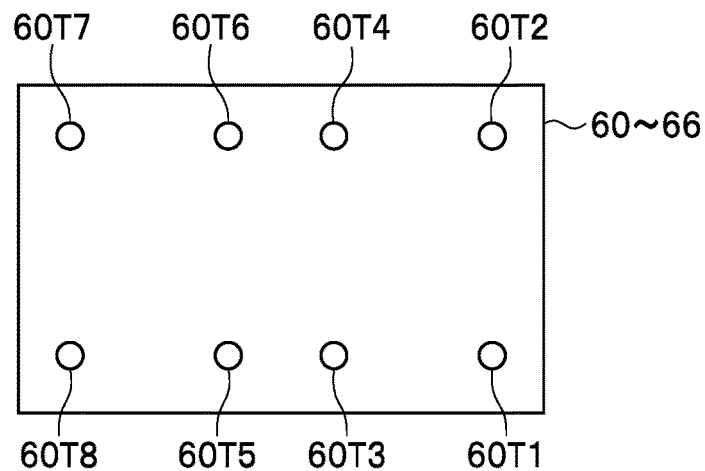
FIG. 5C is an explanatory diagram showing respective patterned surfaces of tenth and sixteenth dielectric layers of the stack of the multilayer filter device according to the embodiment of the invention.

FIG. 5C shows the patterned surface of each of the tenth to sixteenth dielectric layers 60 to 66. In each of the dielectric layers 60 to 66, there are formed through holes 60T1, 60T2, 60T3, 60T4, 60T5, 60T6, 60T7, and 60T8. The through holes 59T1 to 59T8 formed in the dielectric layer 59 are connected to the through holes 60T1 to 60T8 formed in the dielectric layer 60, respectively. In the dielectric layers 60 to 66, every vertically adjacent through holes denoted by the same reference numerals are connected to each other.

Figure 6A:
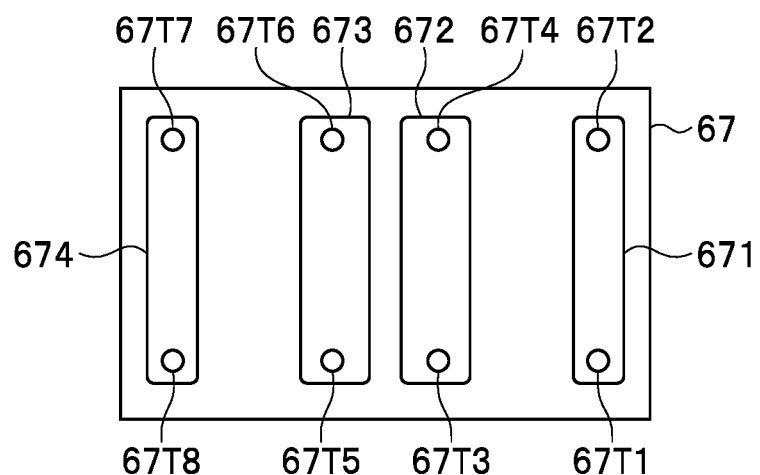
FIG. 6A and FIG. 6B are explanatory diagrams showing respective patterned surfaces of seventeenth to eighteenth dielectric layers of the stack of the multilayer filter device according to the embodiment of the invention.

FIG. 6A shows the patterned surface of the seventeenth dielectric layer 67. Conductor layers 671, 672, 673, and 674 are formed on the patterned surface of the dielectric layer 67. Each of the conductor layers 671 to 674 has a first end and a second end opposite to each other. Further, through holes 67T1, 67T2, 67T3, 67T4, 67T5, 67T6, 67T7, and 67T8 are formed in the dielectric layer 67. The through hole 60T1 formed in the dielectric layer 66 and the through hole 67T1 are connected to a portion of the conductor layer 671 near the first end thereof. The through hole 60T2 formed in the dielectric layer 66 and the through hole 67T2 are connected to a portion of the conductor layer 671 near the second end thereof. The through hole 60T3 formed in the dielectric layer 66 and the through hole 67T3 are connected to a portion of the conductor layer 672 near the first end thereof. The through hole 60T4 formed in the dielectric layer 66 and the through hole 67T4 are connected to a portion of the conductor layer 672 near the second end thereof. The through hole 60T5 formed in the dielectric layer 66 and the through hole 67T5 are connected to a portion of the conductor layer 673 near the first end thereof. The through hole 60T6 formed in the dielectric layer 66 and the through hole 67T6 are connected to a portion of the conductor layer 673 near the second end thereof. The through hole 60T7 formed in the dielectric layer 66 and the through hole 67T7 are connected to a portion of the conductor layer 674 near the first end thereof. The through hole 60T8 formed in the dielectric layer 66 and the through hole 67T8 are connected to a portion of the conductor layer 674 near the second end thereof.

Figure 6B:
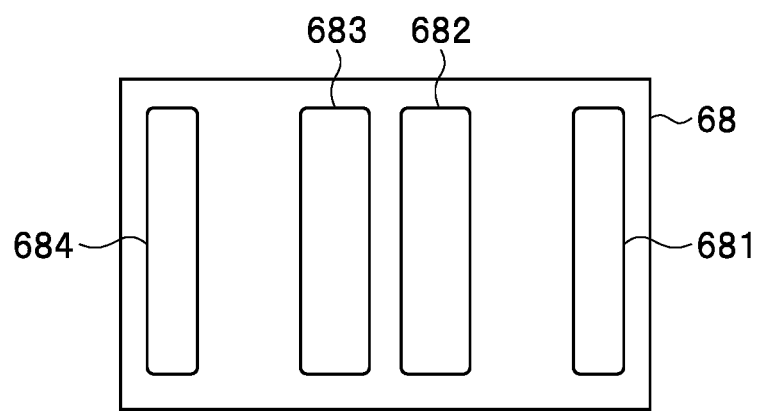

FIG. 6B shows the patterned surface of the eighteenth dielectric layer 68. Conductor layers 681, 682, 683 and 684 are formed on the patterned surface of the dielectric layer 68. Each of the conductor layers 681 to 684 has a first end and a second end opposite to each other. The through hole 67T1 formed in the dielectric layer 67 is connected to a portion of the conductor layer 681 near the first end thereof. The through hole 67T2 formed in the dielectric layer 67 is connected to a portion of the conductor layer 681 near the second end thereof. The through hole 67T3 formed in the dielectric layer 67 is connected to a portion of the conductor layer 682 near the first end thereof. The through hole 67T4 formed in the dielectric layer 67 is connected to a portion of the conductor layer 682 near the second end thereof. The through hole 67T5 formed in the dielectric layer 67 is connected to a portion of the conductor layer 683 near the first end thereof. The through hole 67T6 formed in the dielectric layer 67 is connected to a portion of the conductor layer 683 near the second end thereof. The through hole 67T7 formed in the dielectric layer 67 is connected to a portion of the conductor layer 684 near the first end thereof. The through hole 67T8 formed in the dielectric layer 67 is connected to a portion of the conductor layer 684 near the second end thereof.

The stack 50 shown in FIG. 2 is formed by stacking the first to eighteenth dielectric layers 51 to 68 such that the patterned surface of the first dielectric layer 51 serves as the bottom surface 50A of the stack 50 and the surface of the eighteenth dielectric layer 68 opposite to the patterned surface thereof serves as the top surface 50B of the stack 50.

Figure 7:
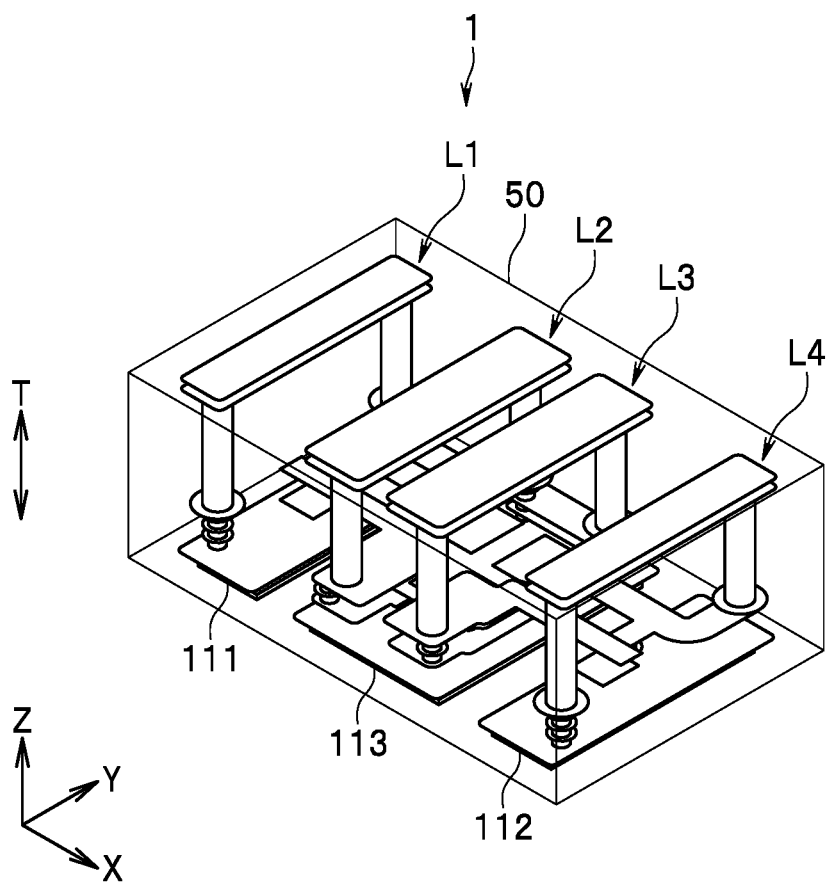
FIG. 7 is an internal perspective view showing the stack of the multilayer filter device according to the embodiment of the invention.

FIG. 7 shows the internal structure of the stack 50 formed by stacking the first to eighteenth dielectric layers 51 to 68. As shown in FIG. 7, the plurality of conductor layers and the plurality of through holes shown in FIG. 3A to FIG. 6B are stacked in the stack 50.

Correspondences between the circuit components of the filter 5 shown in FIG. 1 and the internal components of the stack 50 shown in FIG. 3A to FIG. 6B will now be described. The inductor L1 is composed of the conductor layers 671 and 681 and the through holes 56T1, 56T2, 57T1, 57T2, 59T1, 59T2, 60T1, 60T2, 67T1, and 67T2 shown in FIG. 4C to FIG. 6B.

The inductor L2 is composed of the conductor layers 672 and 682 and the through holes 56T3, 56T4, 57T3, 57T4, 59T3, 59T4, 60T3, 60T4, 67T3, and 67T4 shown in FIG. 4C to FIG. 6B.

The inductor L3 is composed of the conductor layers 673 and 683 and the through holes 56T5, 56T6, 57T5, 57T6, 59T5, 59T6, 60T5, 60T6, 67T5, and 67T6 shown in FIG. 4C to FIG. 6B.

The inductor L4 is composed of the conductor layers 674 and 684 and the through holes 56T7, 56T8, 57T7, 57T8, 59T7, 59T8, 60T7, 60T8, 67T7, and 67T8 shown in FIG. 4C to FIG. 6B.

The capacitor C1 is composed of the conductor layers 521 and 541 shown in FIG. 3B and FIG. 4A, and the dielectric layers 52 and 53 each interposed between those conductor layers.

The capacitor C2 is composed of the ground conductor layer 523 shown in FIG. 3B, the conductor layer 551 shown in FIG. 4B, and the dielectric layers 52 to 54 each interposed between those conductor layers.

The capacitor C3 is composed of the conductor layers 541 and 561 shown in FIG. 4A and FIG. 4C, and the dielectric layers 54 and 55 each interposed between those conductor layers.

The capacitor C4 is composed of the conductor layers 552 and 561 shown in FIG. 4B and FIG. 4C, and the dielectric layer 55 interposed between those conductor layers. The capacitor C5 is composed of the conductor layers 552 and 562 shown in FIG. 4B and FIG. 4C, and the dielectric layer 55 interposed between those conductor layers.

The capacitor C7 is composed of the ground conductor layer 523 shown in FIG. 3B, the conductor layer 542 shown in FIG. 4A, and the dielectric layers 52 and 53 each interposed between those conductor layers. The capacitor C8 is composed of the ground conductor layer 523, the conductor layer 543 shown in FIG. 4A, and the dielectric layers 52 and 53 each interposed between those conductor layers.

The capacitor C9 is composed of the conductor layers 551 and 591 shown in FIG. 4B and FIG. 5B, and the dielectric layers 55 to 58 each interposed between those conductor layers. The capacitor C10 is composed of the conductor layers 553 and 591 shown in FIG. 4B and FIG. 5B, and the dielectric layers 55 to 58 each interposed between those conductor layers.

The capacitor C11 is composed of the conductor layers 522 and 545 shown in FIG. 3B and FIG. 4A, and the dielectric layers 52 and 53 each interposed between those conductor layers.

The capacitor C12 is composed of the ground conductor layer 523 shown in FIG. 3B, the conductor layer 553 shown in FIG. 4B, and the dielectric layers 52 to 54 each interposed between those conductor layers.

Next, structural features of the filter device 1 will be described with reference to FIG. 1 to FIG. 7. As described above, the plurality of dielectric layers constituting the stack 50 include the first and second dielectric layers. In the present embodiment, the dielectric layers 52 to 55 correspond to the first dielectric layers. The dielectric layers 51 and 56 to 68 correspond to the second dielectric layers. The dielectric layers 52 to 55 will hereinafter be referred to also as the first dielectric layers 52 to 55, and the dielectric layers 51 and 56 to 68 as the second dielectric layers 51 and 56 to 68.

The second dielectric layer 51 is interposed between the first dielectric layers 52 to 55 and the bottom surface 50A of the stack 50. The second dielectric layers 56 to 68 are interposed between the first dielectric layers 52 to 55 and the top surface 50B of the stack 50. The first dielectric layers 52 to 55 are located closer to the bottom surface 50A than to the top surface 50B. The first dielectric layers 52 to 55 are located between the second dielectric layer 51 and the second dielectric layer 56.

In the present embodiment, the conductor layers 521 to 523, 531, 541 to 545, and 551 to 553 correspond to the first conductor layers. The conductor layers 521 to 523 are in contact with the patterned surface of the first dielectric layer 52. The conductor layer 531 is in contact with the patterned surface of the first dielectric layer 53. The conductor layers 541 to 545 are in contact with the patterned surface of the first dielectric layer 54. The conductor layers 551 to 553 are in contact with the patterned surface of the first dielectric layer 55.

The conductor layers 591, 671 to 673, and 681 to 683 correspond to the second conductor layers. The conductor layer 591 is in contact with the patterned surface of the second dielectric layer 59. The conductor layers 671 to 673 are in contact with the patterned surface of the second dielectric layer 67. The conductor layers 681 to 683 are in contact with the patterned surface of the second dielectric layer 68.

The conductor layers 561 and 562 correspond to both the first and second conductor layers. The conductor layers 561 and 562 are in contact with the surface of the first dielectric layer 55 opposite to the patterned surface thereof and are in contact with the patterned surface of the second dielectric layer 56.

The capacitors other than the capacitors C9 and C10 are each constituted by at least one first dielectric layer and two first conductor layers that are located to sandwich the at least one first dielectric layer therebetween. For example, the capacitor C1 is constituted by the first dielectric layers 52 and 53 and the conductor layers 521 and 541, where the conductor layers 521 and 541 are located to sandwich the first dielectric layers 52 and 53 therebetween.

The inductors L1 to L4 are formed using the second conductor layers 671 to 673 and 681 to 683. The through holes 56T1 to 56T8, 57T1 to 57T8, 59T1 to 59T8, 60T1 to 60T8, and 67T1 to 67T8 constituting the inductors L1 to L4 are formed in the second dielectric layers 56 to 67. The inductors L1 to L4 can thus be said to be embedded in the second dielectric layers 56 to 68.

Now, the operation and effects of the filter device 1 according to the present embodiment will be described. In the present embodiment, the stack 50 includes the first dielectric layers 52 to 55 and the second dielectric layers 51 and 56 to 68. The first dielectric layers 52 to 55 are formed of the first dielectric material. The second dielectric layers 51 and 56 to 68 are formed of the second dielectric material. The temperature coefficient of resonant frequency tf of the first dielectric material has a positive value. The temperature coefficient of resonant frequency tf of the second dielectric material has a negative value. According to the present embodiment, the combination of the foregoing two dielectric materials having the temperature coefficients of resonant frequency tf of opposite signs can reduce a change in the pass characteristic of the filter 5 due to temperature.

Results of an experiment examining the effect of the present embodiment will now be described. Filter devices fabricated for the experiment will initially be described. In the experiment, a filter device of a practical example and a filter device of a comparative example were fabricated. The filter device of the practical example has the same configuration as the filter device 1 according to the present embodiment described with reference to FIG. 1 to FIG. 7. The filter device of the comparative example was configured in the same way as the filter device of the practical example except for the configurations of the dielectric layers. All the plurality of dielectric layers in the filter device of the comparative example were first dielectric layers.

In the experiment, the foregoing first ceramic was used as the first dielectric material forming the first dielectric layers. The temperature coefficient of resonant frequency tf of the first dielectric material was 40 ppm/° C. The relative permittivity of the first dielectric material at 1.9 GHz was 33.

In the experiment, the foregoing second ceramic was used as the second dielectric material forming the second dielectric layers. The temperature coefficient of resonant frequency tf of the second dielectric material was −70 ppm/° C. The relative permittivity of the second dielectric material at 1.9 GHz was 7.1.

In the experiment, the filter device of the practical example was designed so that the filter 5 had a passband of 4.4 to 5.0 GHz. The filter device of the comparative example was designed so that the filter 5 had a passband of 3.0 to 4.2 GHz.

Next, a method for measuring the characteristics of each of the filter devices of the practical example and the comparative example will be described. In the experiment, the pass characteristic of the filter device of the practical example was determined when the temperatures of the filter device of the practical example were changed to −40° C., 25° C., and 85° C. In the experiment, the pass characteristic of the filter device of the comparative example was determined when the temperatures of the filter device of the comparative example were changed to −40° C., 25° C., and 105° C.

Figure 8:
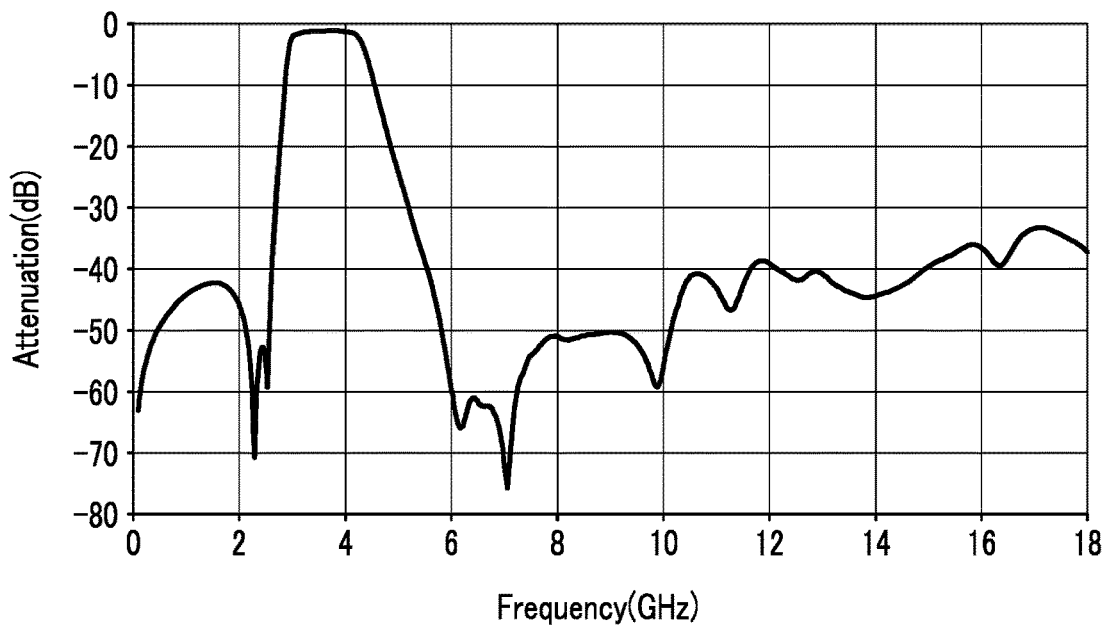
FIG. 8 is a characteristic chart showing a pass characteristic of a multilayer filter device of a comparative example.
Figure 9:
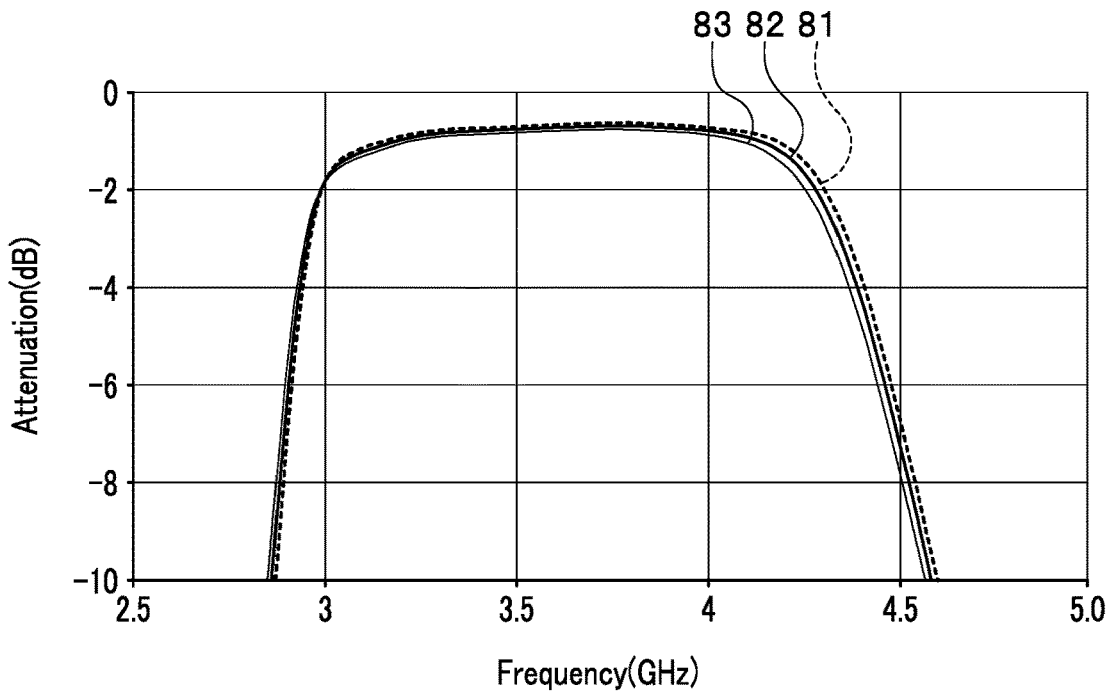
FIG. 9 is a characteristic chart showing a pass characteristic of the multilayer filter device of the comparative example.

Next, the results of the experiment will be described. The filter device of the comparative example will initially be described. FIG. 8 and FIG. 9 show the pass characteristic of the filter device of the comparative example. FIG. 8 shows the pass characteristic when the temperature was 25° C. FIG. 9 shows the pass characteristic when the temperature was −40° C., 25° C., and 105° C. FIG. 9 shows the pass characteristic in the vicinity of the passband in an enlarged scale. In each of FIG. 8 and FIG. 9, the horizontal axis indicates the frequency, the vertical axis the attenuation. In FIG. 9, the reference numerals 81, 82, and 83 denote the pass characteristic at −40° C., 25° C., and 105° C., respectively. From FIG. 9, it can be seen that the curve showing the pass characteristic of the filter device of the comparative example shifts to lower or higher frequencies depending on the temperature. In particular, the curve showing the pass characteristic of the filter device of the comparative example shifts to lower frequencies as the temperature increases.

The frequency when the attenuation at the low frequency side of the passband of the filter device of the comparative example was −10 dB was 2.871 GHz at the temperature of −40° C., 2.862 GHz at the temperature of 25° C., and 2.849 GHz at the temperature of 105° C. The frequency when the attenuation at the high frequency side of the passband of the filter device of the comparative example was −10 dB was 4.589 GHz at the temperature of −40° C., 4.574 GHz at the temperature of 25° C., and 4.552 GHz at the temperature of 105° C.

The amount of frequency variation will be defined as follows. A frequency where the attenuation is −10 dB at the temperature of 25° C. will be referred to as a reference frequency. The amount of variation of the frequency where the attenuation is −10 dB at a specific temperature from the reference frequency is defined as the amount of frequency variation at the specific temperature. The amount of frequency variation is separately determined at the low frequency side of the passband and the high frequency side of the passband separately. From the foregoing definition, the amount of frequency variation at 25° C. is 0.

On the low frequency side of the passband, the amount of frequency variation was 0.31% at −40° C. and −0.45% at 105° C. On the high frequency side of the passband, the amount of frequency variation was 0.33% at −40° C. and −0.48% at 105° C.

Figure 10:
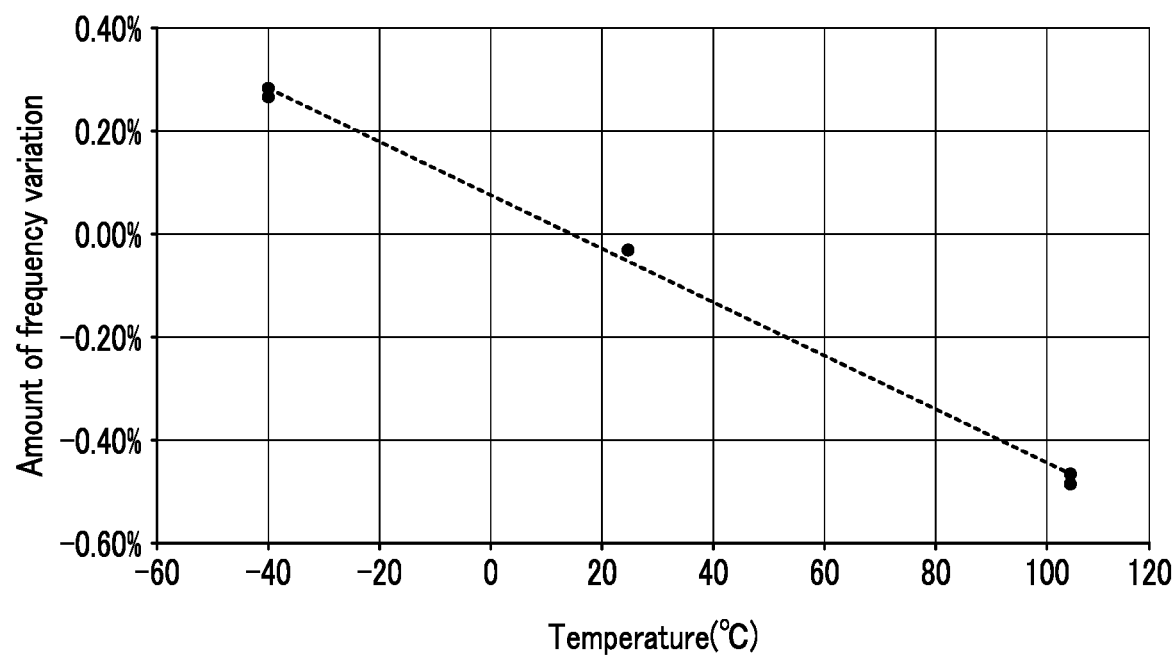
FIG. 10 is a characteristic chart showing a relationship between temperature and an amount of frequency variation of the multilayer filter device of the comparative example.

FIG. 10 is a characteristic chart showing the relationship between the temperature and the amount of frequency variation of the filter device of the comparative example. In FIG. 10, the horizontal axis indicates the temperature, the vertical axis the amount of frequency variation. In FIG. 10, the broken line is a linear regression representing the relationship between the temperature and the amount of frequency variation. The gradient of the linear regression indicates the amount of change in the pass characteristic in the vicinity of the passband when the temperature changes. The gradient of the linear regression shown in FIG. 10 is −54.6 ppm/° C.

Figure 11:
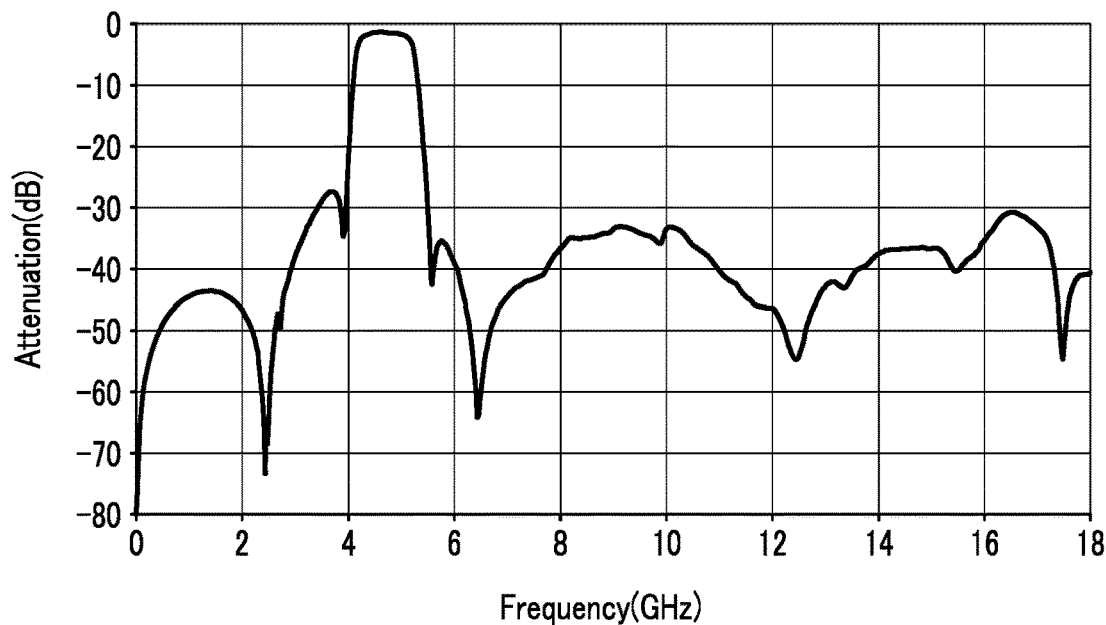
FIG. 11 is a characteristic chart showing the pass characteristic of the multilayer filter device of a practical example
Figure 12:
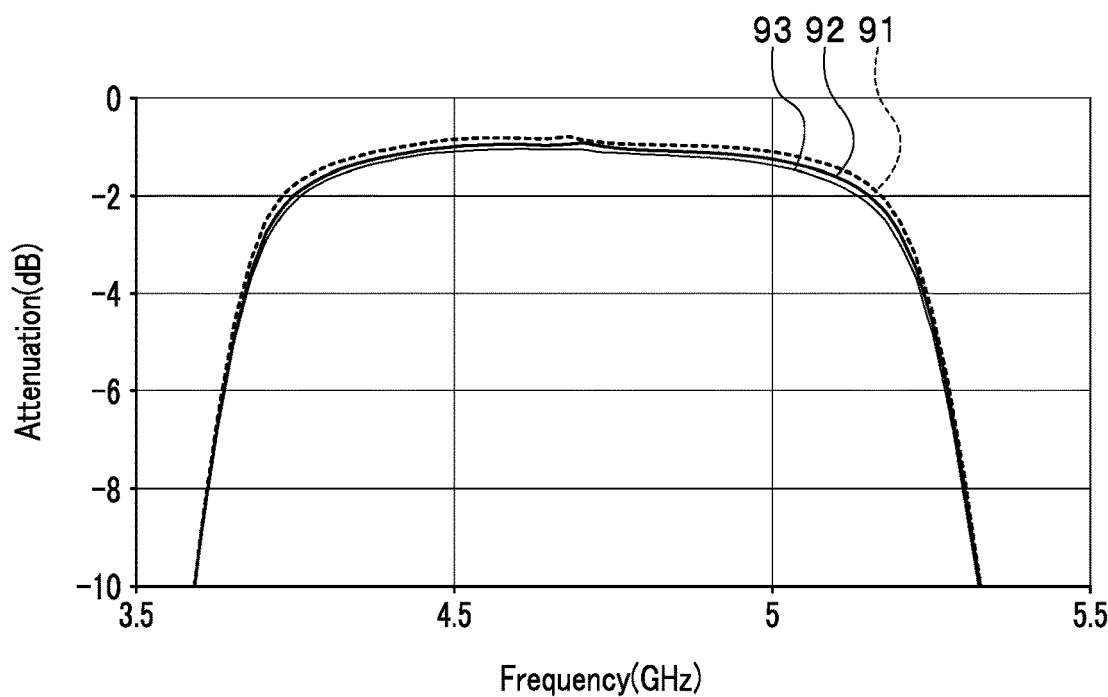
FIG. 12 is a characteristic chart showing the pass characteristic of the multilayer filter device of the practical example.

Next, the filter device of the practical example will be described. FIG. 11 and FIG. 12 show the pass characteristic of the filter device of the practical example. FIG. 11 shows the pass characteristic when the temperature was 25° C. FIG. 12 shows the pass characteristic when the temperature was −40° C., 25° C., and 85° C. FIG. 12 shows the pass characteristic in the vicinity of the passband in an enlarged scale. In each of FIG. 11 and FIG. 12, the horizontal axis indicates the frequency, the vertical axis the attenuation. In FIG. 11, the reference numerals 91, 92, and 93 denote the pass characteristic at −40° C., 25° C., and 85° C., respectively. From FIG. 12, it can be seen that the curve showing the pass characteristic of the filter device of the practical example hardly shifts to lower or higher frequencies depending on the temperature.

On the low frequency side of the passband, the frequency when the attenuation of the filter device of the practical example was −10 dB was 4.092 GHz at the temperature of −40° C., 4.093 GHz at the temperature of 25° C., and 4.093 GHz at the temperature of 85° C. On the high frequency side of the passband, the frequency when the attenuation was −10 dB was 5.329 GHz at the temperature of −40° C., 5.331 GHz at the temperature of 25° C., and 5.332 GHz at the temperature of 85° C.

On the low frequency side of the passband, the amount of frequency variation of the filter device of the practical example was −0.02% at −40° C. and 0% at 85° C. On the high frequency side of the passband, the amount of frequency variation of the filter device of the practical example was −0.04% at −40° C. and 0.02% at 85° C.

Figure 13:
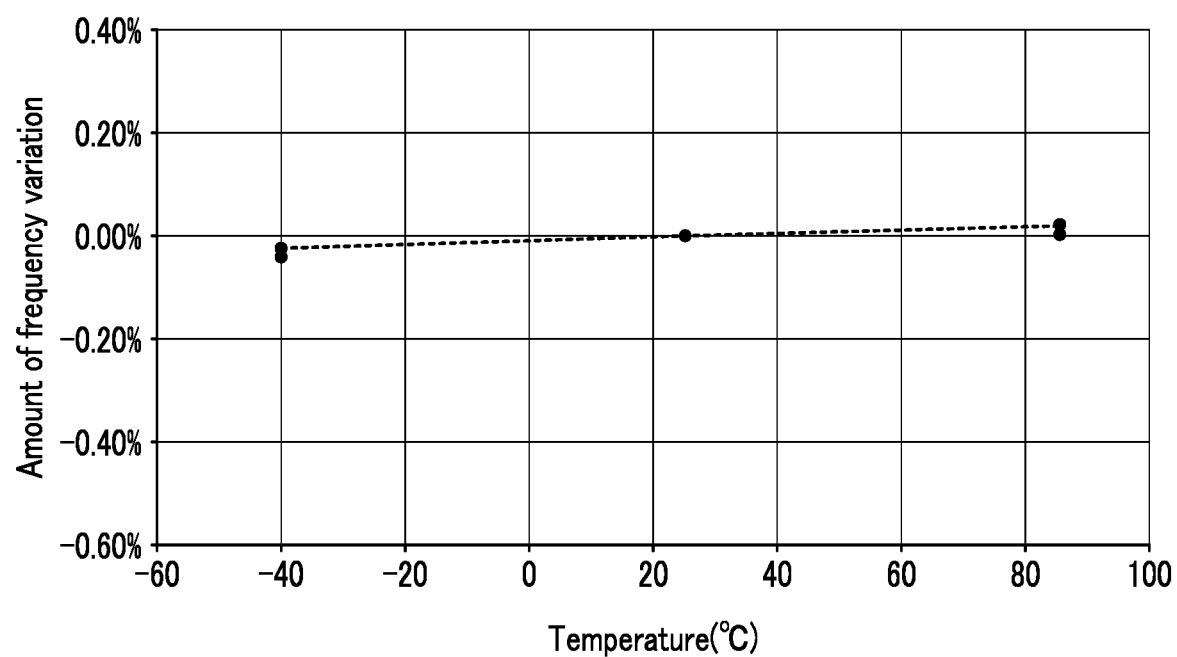
FIG. 13 is a characteristic chart showing the relationship between the temperature and the amount of frequency variation of the multilayer filter device of the practical example.

FIG. 13 is a characteristic chart showing the relationship between the temperature and the amount of frequency variation of the filter device of the practical example. In FIG. 13, the horizontal axis indicates the temperature, the vertical axis the amount of frequency variation. In FIG. 13, the broken line is a linear regression representing the relationship between the temperature and the amount of frequency variation. The gradient of the linear regression shown in FIG. 13 is 3.2 ppm/° C.

From the results shown in FIG. 9, FIG. 10, FIG. 12, and FIG. 13, it can be seen that the filter device of the practical example does not change much with regard to its pass characteristic due to a change in temperature. As can be understood from the results, according to the present embodiment, a change in the pass characteristic of the filter 5 due to temperature can be reduced compared to the case where all the plurality of dielectric layers are formed of the same dielectric material.

Figure 14:
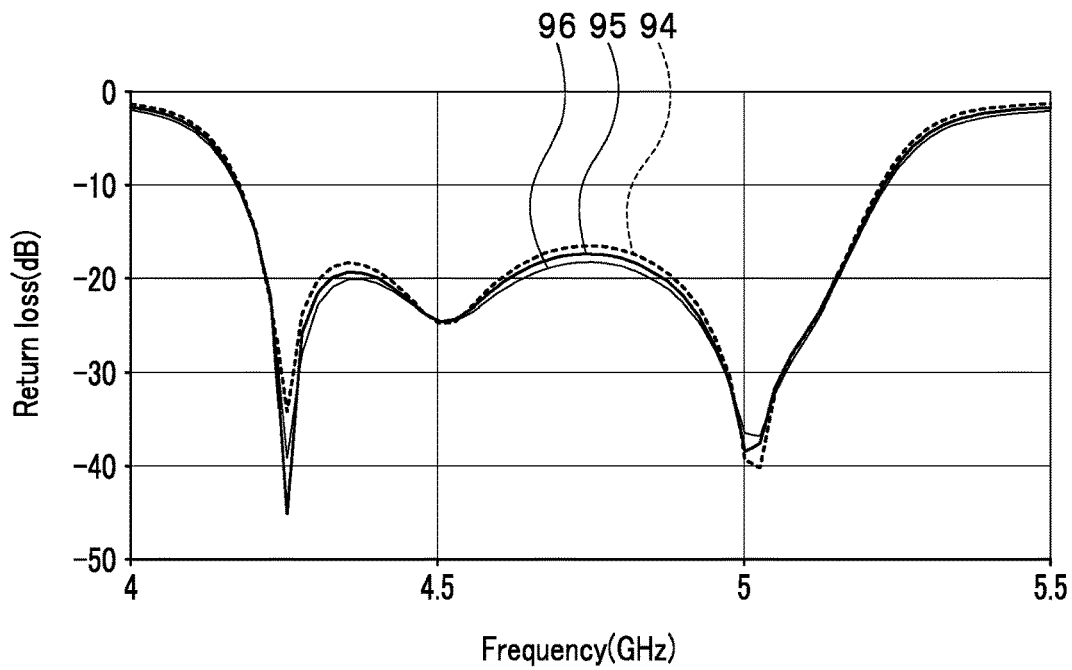
FIG. 14 is a characteristic chart showing return loss at a first port of the multilayer filter device of the practical example.
Figure 15:
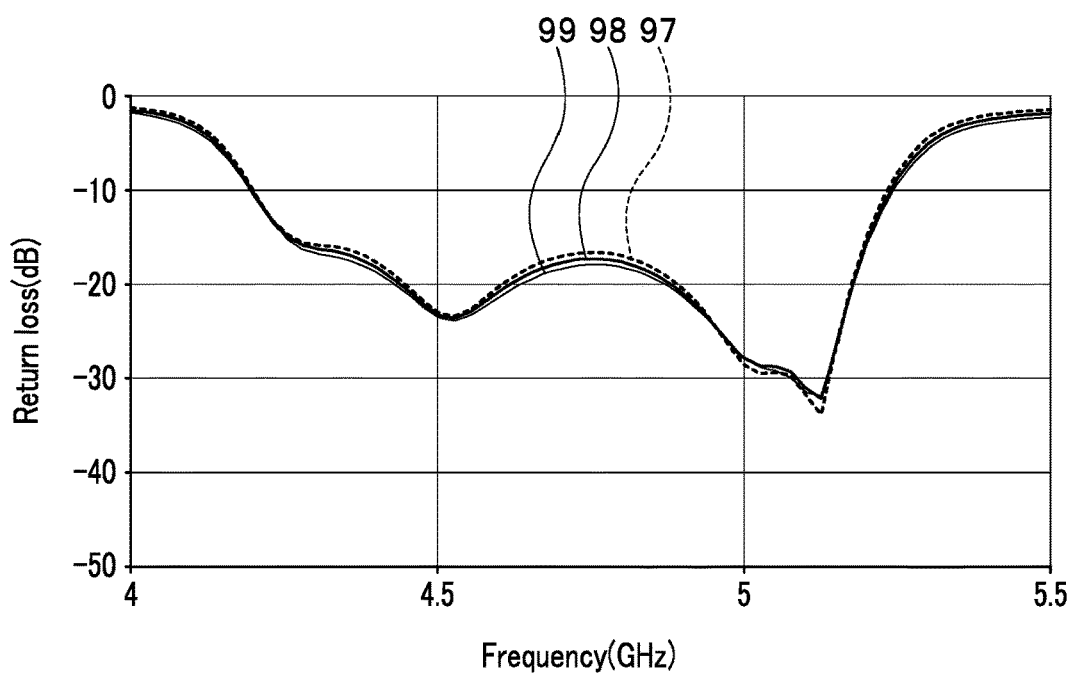
FIG. 15 is a characteristic chart showing return loss at a second port of the multilayer filter device of the practical example.

A change in the pass characteristic of the filter 5 due to temperature has been described so far. However, according to the present embodiment, a temperature-based change in characteristics of the filter 5 other than the pass characteristic can also be reduced. FIG. 14 is a characteristic chart showing the return loss at the first port 2 of the filter device of the practical example. FIG. 15 is a characteristic chart showing the return loss at the second port 3 of the filter device of the practical example. In FIG. 14 and FIG. 15, the horizontal axis indicates the frequency, and the vertical axis the return loss. In FIG. 14, the reference numerals 94, 95, and 96 denote the return loss at −40° C., 25° C., and at 90° C., respectively. In FIG. 15, the reference numerals 97, 98, and 99 denote the return loss at −40° C., 25° C., and 90° C., respectively. From FIG. 14 and FIG. 15, it can be seen that the return loss of the filter device of the practical example does not change much due to a change in temperature. As can be understood from the results, according to the present embodiment, a change in the return loss due to temperature can be reduced.

Next, other effects of the present embodiment will be described. In the present embodiment, the first dielectric layers 52 to 55 are used to form a large number of capacitors except for the capacitors C9 and C10. The first dielectric layers 52 to 55 have a relative permittivity higher than that of the second dielectric layers 51, and 56 to 68. According to the present embodiment, the areas of the conductor layers constituting the capacitors can thus be reduced. As a result, according to the present embodiment, the filter device 1 can be reduced in size.

In the present embodiment, the inductors L1 to LA are embedded in the second dielectric layers 56 to 68, which have a relative permittivity lower than that of the first dielectric layers 52 to 55. According to the present embodiment, the formation of capacitances between the inductors can be suppressed to prevent a deterioration in characteristics such as spurious generation.

In the present embodiment, the first dielectric layers 52 to 55 are located between the second dielectric layer 51 and the second dielectric layer 56. In other words, the second dielectric layer 51, which has a low relative permittivity, is interposed between the first dielectric layers 52 to 55 and the bottom surface 50A of the stack 50. According to the present embodiment, effects of the ground of the substrate on which the filter device 1 is mounted can be reduced compared to the case where a first dielectric layer is interposed between the first dielectric layers 52 to 55 and the bottom surface 50A of the stack 50.

In the present embodiment, a change in the pass characteristic of the filter 5 due to temperature can be reduced. The filter device 1 according to the present embodiment is thus suited for a band-pass filter where a lower cutoff frequency, or the lower limit of the passband, and an upper cutoff frequency, or the upper limit of the passband, are set and a narrow passband is desired in particular. The passband may have a width in a range of 10 to 600 MHz or a narrower range of 10 to 200 MHz.

Figure 16:
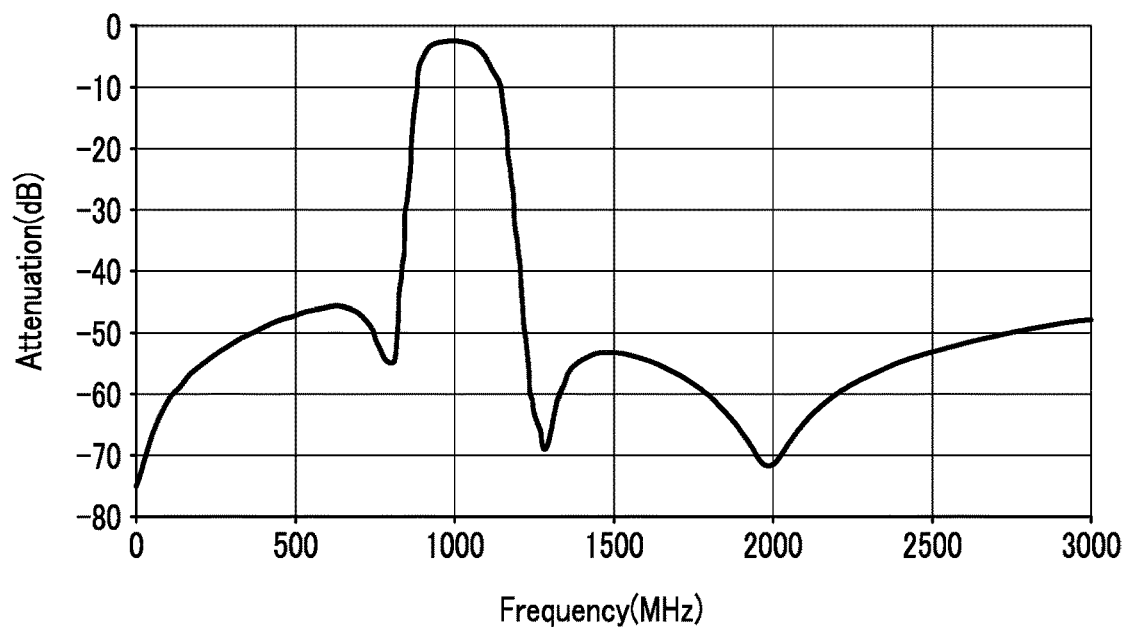
FIG. 16 is a characteristic chart showing an example of the pass characteristic of the multilayer filter device according to the embodiment of the present invention.
Figure 17:
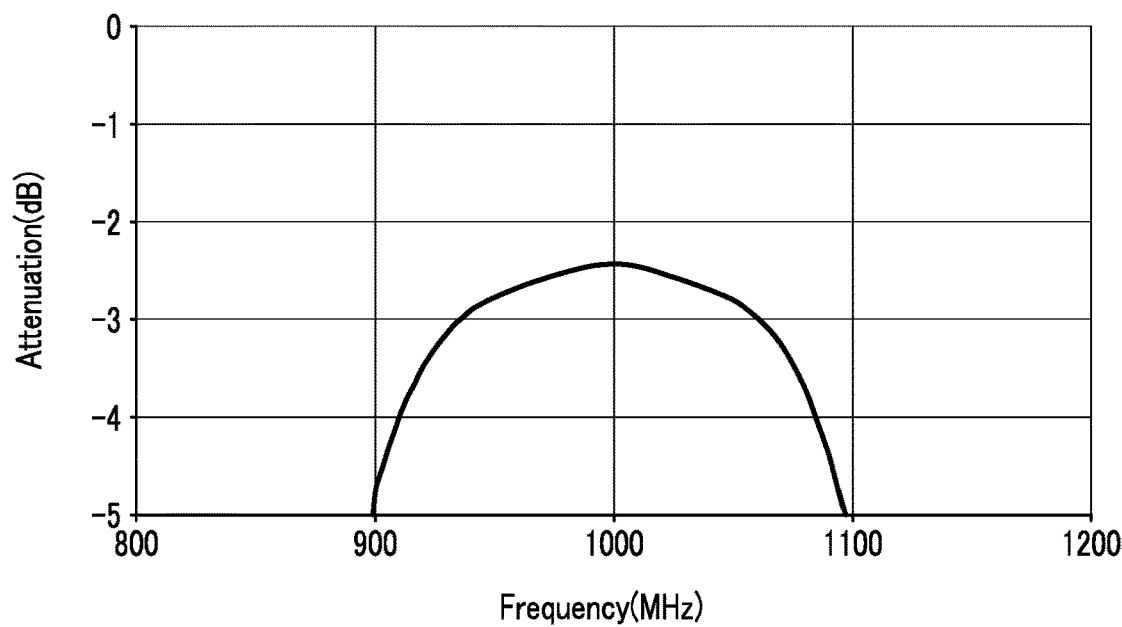
FIG. 17 is a characteristic chart showing an example of the pass characteristic of the multilayer filter device according to the embodiment of the present invention.

FIG. 16 and FIG. 17 show an example of a pass characteristic of the filter device 1 when the filter 5 is designed to have a passband of 950 to 1050 MHz. FIG. 17 shows the pass characteristic in the vicinity of the passband in an enlarged scale. In each of FIG. 16 and FIG. 17, the horizontal axis indicates the frequency, the vertical axis the attenuation.

The present invention is not limited to the foregoing embodiment, and various modifications may be made thereto. For example, the multilayer filter device according to the present invention is not limited to a band-pass filter, and can be applied to layered filter devices including a plurality of filters in general. Examples include a diplexer for separating two signals of different frequency bands, and a triplexer for separating three signals of different frequency bands.

The filter 5 and the stack 50 according to the present invention are not limited to the configurations in the example described in the embodiment, and may have any configuration as long as the requirements set forth in the claims are met. For example, the stack 50 may include a first dielectric layer located on the second dielectric layer 68.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A multilayer filter device comprising:
   a filter that includes at least one inductor and at least one capacitor; and
   a stack that includes a plurality of dielectric layers and a plurality of conductor layers stacked together, where the stack is intended to integrate the at least one inductor and the at least one capacitor; wherein
   the at least one inductor and the at least one capacitor are formed using the plurality of conductor layers;
   the plurality of dielectric layers include at least one first dielectric layer and at least one second dielectric layer;
   the plurality of conductor layers include at least one first conductor layer in contact with the at least one first dielectric layer, and at least one second conductor layer in contact with the at least one second dielectric layer;
   the at least one first dielectric layer is formed of a first dielectric material having a positive temperature coefficient of resonant frequency;
   the at least one second dielectric layer is formed of a second dielectric material having a negative temperature coefficient of resonant frequency; and
   a total dimension of the at least one first dielectric layer in a stacking direction of the plurality of dielectric layers is smaller than a total dimension of the at least one second dielectric layer in the stacking direction.

2. The multilayer filter device according to claim 1, wherein:
   the stack has a bottom surface and a top surface that are located at two ends thereof in the stacking direction, and four side surfaces connecting the bottom surface and the top surface; and
   the at least one first dielectric layer is located closer to the bottom surface than to the top surface.

3. The multilayer filter device according to claim 1, wherein:
   the at least one second dielectric layer includes a plurality of second dielectric layers; and
   the at least one first dielectric layer is located between one second dielectric layer and another in the plurality of second dielectric layers.

4. The multilayer filter device according to claim 1, wherein:
   the at least one capacitor includes a plurality of capacitors;
   the at least one first conductor layer includes a plurality of first conductor layers; and
   at least one of the plurality of capacitors is constituted by the at least one first dielectric layer and two of the first conductor layers, where the two first conductor layers are located to sandwich the at least one first dielectric layer therebetween.

5. The multilayer filter device according to claim 1, wherein the at least one inductor is formed using the at least one second conductor layer.

6. The multilayer filter device according to claim 1, wherein the filter is a band-pass filter that selectively passes a signal of a frequency within a predetermined passband.

7. The multilayer filter device according to claim 6, wherein the passband has a width in a range of 10 to 600 MHz.

8. A multilayer filter device comprising:
   a filter that includes at least one inductor and at least one capacitor; and
   a stack that includes a plurality of dielectric layers and a plurality of conductor layers stacked together, where the stack is intended to integrate the at least one inductor and the at least one capacitor; wherein
   the at least one inductor and the at least one capacitor are formed using the plurality of conductor layers;
   the plurality of dielectric layers include at least one first dielectric layer and at least one second dielectric layer;

the plurality of conductor layers include at least one first conductor layer in contact with the at least one first dielectric layer, and at least one second conductor layer in contact with the at least one second dielectric layer;

the first dielectric layer is formed of a first dielectric material having a positive temperature coefficient of resonant frequency; and the second dielectric layer is formed of a second dielectric material having a negative temperature coefficient of resonant frequency, wherein:

the at least one second dielectric layer includes a plurality of second dielectric layers; and the at least one first dielectric layer is located between one second dielectric layer and another in the plurality of second dielectric layers.

9. A multilayer filter device comprising:

a filter that includes at least one inductor and at least one capacitor; and a stack that includes a plurality of dielectric layers and a plurality of conductor layers stacked together, where the stack is intended to integrate the at least one inductor and the at least one capacitor; wherein the at least one inductor and the at least one capacitor are formed using the plurality of conductor layers;

the plurality of dielectric layers include at least one first dielectric layer and at least one second dielectric layer;

the plurality of conductor layers include at least one first conductor layer in contact with the at least one first dielectric layer, and at least one second conductor layer in contact with the at least one second dielectric layer;

the first dielectric layer is formed of a first dielectric material having a positive temperature coefficient of resonant frequency; and the second dielectric layer is formed of a second dielectric material having a negative temperature coefficient of resonant frequency, wherein:

the at least one capacitor includes a plurality of capacitors;

the at least one first conductor layer includes a plurality of first conductor layers; and at least one of the plurality of capacitors is constituted by the at least one first dielectric layer and two of the first conductor layers, where the two are located to sandwich the at least one first dielectric layer therebetween.

\* \* \* \* \*